United States Patent
Ishizaka

(10) Patent No.: US 10,629,433 B2
(45) Date of Patent: Apr. 21, 2020

(54) METHOD OF MANUFACTURING RUTHENIUM WIRING

(71) Applicant: Tokyo Electron Limited, Tokyo (JP)

(72) Inventor: Tadahiro Ishizaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 122 days.

(21) Appl. No.: 15/899,602

(22) Filed: Feb. 20, 2018

(65) Prior Publication Data
US 2018/0254181 A1 Sep. 6, 2018

(30) Foreign Application Priority Data
Mar. 2, 2017 (JP) .................. 2017-039146

(51) Int. Cl.
*H01L 21/02* (2006.01)
*H01L 21/321* (2006.01)
(Continued)

(52) U.S. Cl.
CPC ........ *H01L 21/0262* (2013.01); *C23C 16/045* (2013.01); *C23C 16/16* (2013.01); *C23C 16/18* (2013.01); *H01L 21/0228* (2013.01); *H01L 21/02186* (2013.01); *H01L 21/28556* (2013.01); *H01L 21/324* (2013.01); *H01L 21/3212* (2013.01); *H01L 21/76877* (2013.01); *H01L 21/76883* (2013.01); *H01L 23/53266* (2013.01)

(58) Field of Classification Search
CPC ........... H01L 21/0262; H01L 21/02186; H01L 21/0228; H01L 21/3212; H01L 21/324
See application file for complete search history.

(56) References Cited

U.S. PATENT DOCUMENTS 6,074,945 A * 6/2000 Vaartstra ................. C23C 16/18
257/E21.011
6,291,290 B1 * 9/2001 Arita ....................... H01L 28/75
257/E21.009
(Continued)

FOREIGN PATENT DOCUMENTS

JP 2006-148075 A 6/2006
JP 2010-212601 A 9/2010
(Continued)

OTHER PUBLICATIONS

L.G.Wen et al., Proceeding of IEEE IITC/AMC 2016, pp. 34-36.

*Primary Examiner* — Peniel M Gumedzoe
(74) *Attorney, Agent, or Firm* — Abelman, Frayne & Schwab

(57) ABSTRACT

A first aspect of the present disclosure provides a ruthenium wiring manufacturing method of manufacturing a ruthenium wiring by filling a recess, with respect to a substrate including a predetermined film having the recess formed in a surface thereof. The method includes: embedding a first ruthenium film in the recess by forming the first ruthenium film by CVD using a ruthenium raw material gas; forming an additional layer by forming a second ruthenium film on the first ruthenium film embedded in the recess by CVD using the ruthenium raw material gas at a film forming rate higher than that at a time of embedding; and flattening the second ruthenium film and the first ruthenium film by removing the second ruthenium film and the first ruthenium film on the substrate surface by CMP.

15 Claims, 8 Drawing Sheets

(51) Int. Cl.

| | |
|---|---|
| *H01L 21/324* | (2006.01) |
| *H01L 23/532* | (2006.01) |
| *C23C 16/04* | (2006.01) |
| *H01L 21/768* | (2006.01) |
| *C23C 16/16* | (2006.01) |
| *H01L 21/285* | (2006.01) |
| *C23C 16/18* | (2006.01) |

(56) References Cited

U.S. PATENT DOCUMENTS

| | | | |
|---|---|---|---|
| 2001/0006838 A1* | 7/2001 | Won | C23C 16/0281 |
| | | | 438/396 |
| 2005/0186341 A1* | 8/2005 | Hendrix | C23C 16/0272 |
| | | | 427/248.1 |
| 2006/0211228 A1* | 9/2006 | Matsuda | C23C 16/18 |
| | | | 438/575 |
| 2010/0078815 A1* | 4/2010 | Wang | H01L 21/76877 |
| | | | 257/741 |
| 2012/0091588 A1* | 4/2012 | Miyoshi | C23C 16/0272 |
| | | | 257/751 |
| 2016/0240433 A1* | 8/2016 | Ishizaka | H01L 21/28556 |
| 2017/0271512 A1* | 9/2017 | Adusumilli | H01L 27/0924 |

FOREIGN PATENT DOCUMENTS

| | | |
|---|---|---|
| KR | 10-2001-0066747 A1 | 7/2001 |
| KR | 10-2011-0124304 A1 | 11/2011 |
| KR | 10-1271895 B1 | 6/2013 |

\* cited by examiner

METHOD OF MANUFACTURING RUTHENIUM WIRING

CROSS-REFERENCE TO RELATED APPLICATION

This application is based on and claims priority from Japanese Patent Application No. 2017-039146 filed on Mar. 2, 2017 with the Japan Patent Office, the disclosure of which is incorporated herein in its entirety by reference.

TECHNICAL FIELD

The present disclosure relates to a method of manufacturing a ruthenium wiring.

BACKGROUND

Recently, miniaturization of a wiring has progressed along with miniaturization of semiconductor devices. As a result, a problem in which RC delay caused by an increase in wiring resistance and an increase in coupling capacitance between wirings obstructs a high-speed operation of a device has become obvious. For this reason, copper (Cu), which has a bulk resistance lower than that of aluminum (Al) or tungsten (W), which has conventionally been used as a wiring material, has been used recently, and a low dielectric constant film (Low-k film) has been used as an interlayer insulating film.

However, as the miniaturization progresses further, new problems are emerging in a Cu wiring. That is, according to the ITRS roadmap, a wiring width used in a device of the 14-nm generation is 32 nm. This is narrower than about 39 nm, which is the mean free path of electrons in a Cu material, causing an increase in resistance value due to scattering. Specifically, the resistance value of a wiring is expressed as the sum of the resistance value of a bulk, a resistance factor by surface scattering, and a resistance factor by grain boundary scattering. Since both the resistance factor by surface scattering and the resistance factor by grain boundary scattering are proportional to the mean free path, when the mean free path of electrons becomes larger than the wiring width, collision of electrons with a wiring side surface or a grain boundary becomes dominant, causing an increase in resistance value due to scattering. This becomes more evident as the wiring becomes finer.

Therefore, as a wiring material, researches have been made on ruthenium (Ru), of which the bulk resistance value is not as low as Cu, but the mean free path of electrons in the material is shorter than that of Cu. Specifically, the bulk resistance value of Ru is 7.1 $\mu\Omega$-cm, which is higher than 1.7 $\mu\Omega$-cm of Cu, but the mean free path of electrons therein is 10.8 nm, which is shorter than 38.7 nm in Cu.

In addition, since the melting point of Ru is 2334° C. and is higher than 1085° C., which is the melting point of Cu, Ru is more advantageous than Cu from the viewpoint of electromigration resistance.

Therefore, a technology to form a Ru wiring by embedding a Ru film in a trench by atomic layer deposition (ALD) has been proposed (see, e.g., L. G. Wen et al., Proceeding of IEEE IITC/AMC 2016, pp 34-36). In addition, formation of a Ru film by chemical vapor deposition (CVD) has been performed (see, e.g., Japanese Laid-Open Patent Publication No. 2010-212601).

Meanwhile, as a technology to form a Cu wiring, there has been known a technology in which, after a barrier film is formed on an interlayer insulating film having a trench formed in a semiconductor wafer surface, a Cu film is embedded in the trench, and is then flattened by chemical mechanical polishing (CMP) (see, e.g., Japanese Laid-Open Patent Publication No. 2006-148075). Therefore, even when forming a Ru wiring, it is conceivable to form a Ru film by ALD or CVD and to flatten the Ru film by a CMP treatment.

SUMMARY

A first aspect of the present disclosure provides method of manufacturing a ruthenium wiring on a substrate including a predetermined film having a recess formed in a surface thereof by filling the recess. The method includes: embedding a first ruthenium film in the recess by forming the first ruthenium film by CVD using a ruthenium raw material gas; forming an additional layer by forming a second ruthenium film on the first ruthenium film embedded in the recess by CVD using the ruthenium raw material gas at a film forming rate higher than a film forming rate at a time of embedding; and flattening the second ruthenium film and the first ruthenium film by removing the second ruthenium film and the first ruthenium film on the substrate surface by CMP.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
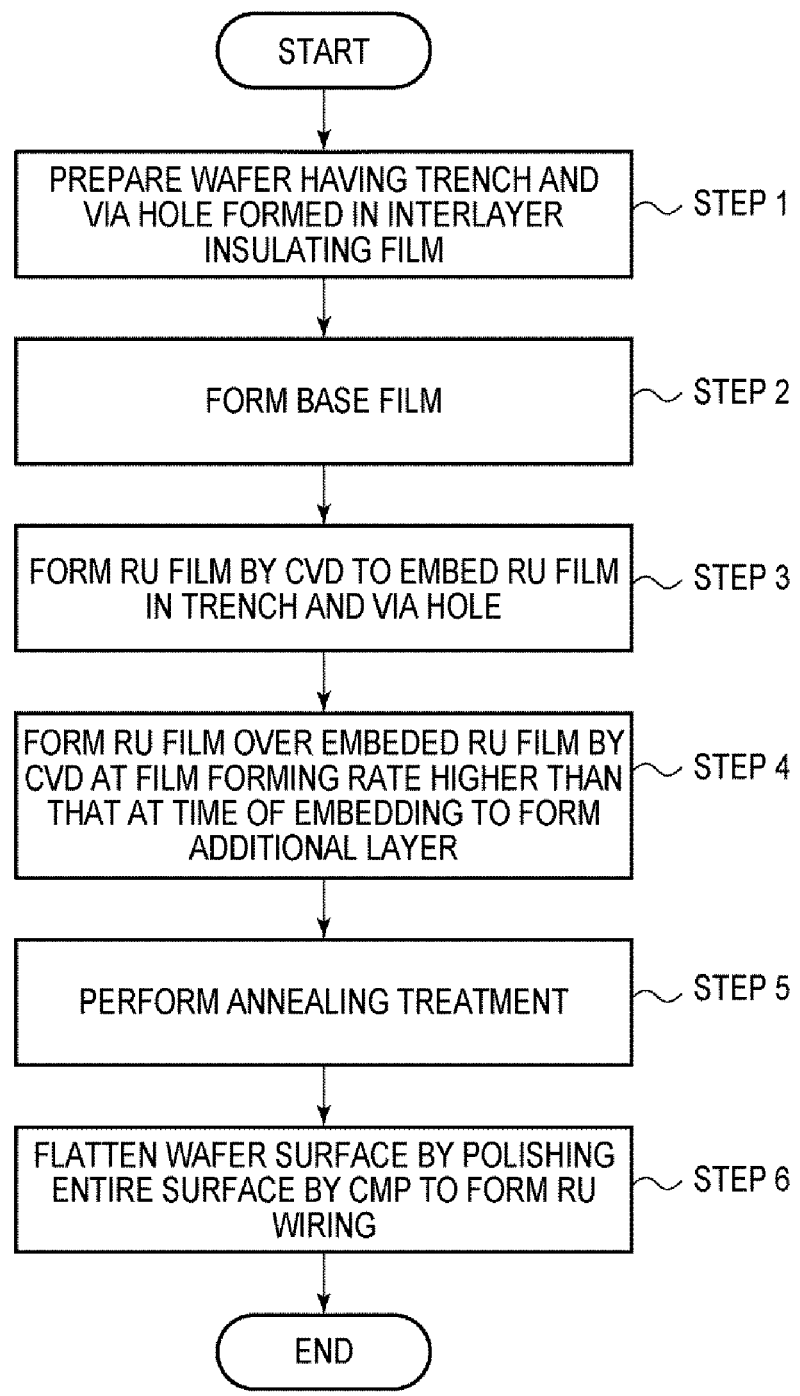
FIG. 1 is a flowchart schematically illustrating a method of manufacturing Ru wiring g to an exemplary embodiment of the present disclosure.

In the following detailed description, reference is made to the accompanying drawings, which form a part hereof. The illustrative embodiments described in the detailed description, drawings, and claims are not meant to be limiting. Other exemplary embodiments may be utilized, and other changes may be made without departing from the spirit or scope of the subject matter presented here.

In a case of flattening by CMP, after embedding the Ru film in the trench, it is necessary to form an additional layer having a thickness equal to or larger than a thickness required for filling the trench, and thus the process time for manufacturing the Ru wiring is increased.

Therefore, the present disclosure provides a method of manufacturing a Ru wiring, which may reduce the time required for manufacturing the Ru wiring.

To solve the above-object, the first aspect of the present disclosure provides method of manufacturing a ruthenium wiring on a substrate including a predetermined film having a recess formed in a surface thereof by filling the recess. The method includes: embedding a first ruthenium film in the recess by forming the first ruthenium film by CVD using a ruthenium raw material gas; forming an additional layer by forming a second ruthenium film on the first ruthenium film embedded in the recess by CVD using the ruthenium raw material gas at a film forming rate higher than a film forming rate at a time of embedding; and flattening the second ruthenium film and the first ruthenium film by removing the second ruthenium film and the first ruthenium film on the substrate surface by CMP.

In the first aspect of the present disclosure, when forming the second ruthenium film in the forming the additional layer, the film forming rate may be set to be higher than the film forming rate of the first ruthenium film through an adjustment of a process parameter value when forming the first ruthenium film. When forming the second ruthenium film in the forming the additional layer, the film forming rate is increased by at least one of increasing a film forming temperature, increasing an amount of supply of a raw material gas, reducing a processing pressure, and increasing a gap between the substrate and a gas discharge surface as the adjustment of the process parameter value.

The first aspect may further include performing an annealing treatment in a hydrogen-containing atmosphere before the performing the flattening.

When forming the formation of the second ruthenium film in the forming the additional layer, the film forming rate may be set to be higher than a film forming rate of the first ruthenium film by adding a hydrogen-containing reducing gas. The hydrogen-containing reducing gas may be at least one of $H_2$ gas, $NH_3$ gas, and $SiH_4$ gas.

A second aspect of the present disclosure provides a method of manufacturing a ruthenium wiring on a substrate including a predetermined film having the recess formed in a surface thereof by filling the recess. The method includes: embedding a first ruthenium film in the recess by forming the first ruthenium film by CVD using a ruthenium raw material gas; forming an additional layer by forming a second ruthenium film on the first ruthenium film embedded in the recess by CVD in which a hydrogen-containing reducing gas is added to the ruthenium raw material gas; and flattening the second ruthenium film and the first ruthenium film by removing the second ruthenium film and the first ruthenium film on the substrate surface by CMP.

In the second aspect of the present disclosure, the hydrogen-containing reducing gas may be at least one of $H_2$ gas, $NH_3$ gas, and $SiH_4$ gas. When forming the second ruthenium film in the forming the additional layer, the film forming rate may be set to be higher than a film forming rate of the first ruthenium film through an adjustment a process parameter value when forming the first ruthenium film. When forming the second ruthenium film in the forming the additional layer, the film forming rate may be increased by at least one of increasing a film forming temperature, increasing an amount of supply of a raw material gas, reducing a processing pressure, and increasing a gap between the substrate and a gas discharge surface, as the adjustment of the process parameter value.

Each of the first and second aspects of the present disclosure may further include forming a base film in the recess before forming the first ruthenium film. The base film may be any one of a TiN film, a Ta film, a TaN film, a TaAlN film, and a TiON film.

The first ruthenium film and the second ruthenium film may be formed using ruthenium carbonyl as the ruthenium raw material gas. When forming the first ruthenium film and the second ruthenium film, the processing temperature when may be in a range of 120 ° C. to 300 ° C., and a pressure may be in a range of 0.013 Pa to 133.33 Pa.

According to the present disclosure, it is possible to provide a method of manufacturing a Ru wiring, which may shorten the time required for manufacturing the Ru wiring.

Hereinafter, exemplary embodiments of the present disclosure will be described in detail with reference to the accompanying drawings.

<Method of Manufacturing Ru Wiring>

First, a method of manufacturing a Ru wiring according to an exemplary embodiment of the present disclosure will be described. FIG. 1 is a flowchart schematically illustrating a method of manufacturing a Ru wiring according to one exemplary embodiment of the present disclosure, and FIGS. 2A to 2F are cross-sectional views illustrating the steps of the method.

First, a semiconductor wafer (hereinafter simply referred to as a "wafer") W is provided. The wafer W has an interlayer insulating film 202 including, for example, a $SiO_2$ film or a low dielectric constant (Low-k) film (e.g., SiCO or SiCOH) on a substrate 201, which is formed of a semiconductor (e.g., Si) and has a lower structure formed therein. A trench 203 is formed in a predetermined pattern in the interlayer insulating film 202, and via holes 204 are formed at a predetermined interval between the bottom portion of the trench 203 and the lower structure (not illustrated) on the substrate 201 (step 1, FIG. 2A).

Figure 2A:
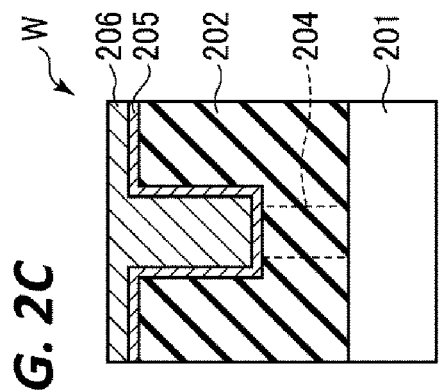
FIGS. 2A to 2F are cross-sectional views schematically and respectively illustrating steps of a method of manufacturing a Ru wiring according to one exemplary embodiment of the present disclosure.
Figure 2B:
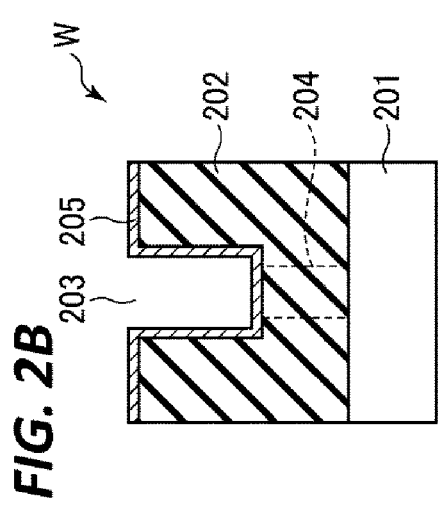

Subsequently, after the wafer W is subjected to a degas process or a pre-clean process as a pretreatment as necessary, a base film 205 is formed on the entire surface including the surface of the trench 203 or each via hole 204 (step 2, FIG. 2B).

A Ru film is harder to diffuse than a Cu film and the necessity of a barrier film is low, but the base film 205 is formed from the viewpoint of improving adhesion to the insulating film. Any base film is available as long as it is capable of improving the adhesion of a Ru film, but it may be desirable that the base film also has a barrier property. A TiN film, a Ta film, a TaN film, a TaAlN film, or a TiON film, which has conventionally been used as a barrier film for a Cu film when forming a Cu wiring may be appropriately used. The thickness of the base film 205 may be in a range of 0.1 nm to 10 nm, preferably in a range of 0.5 nm to 5 nm. The base film may be formed by, for example, ALD, CVD, or ionized physical vapor deposition (iPVD). The TiN film, the TaN film, or the TiON film may be formed by ALD, and the Ta film may be formed by iPVD. Meanwhile, in the case where a Ru film may be directly formed on the interlayer insulating film, the base film 205 is not essential.

Figure 2C:
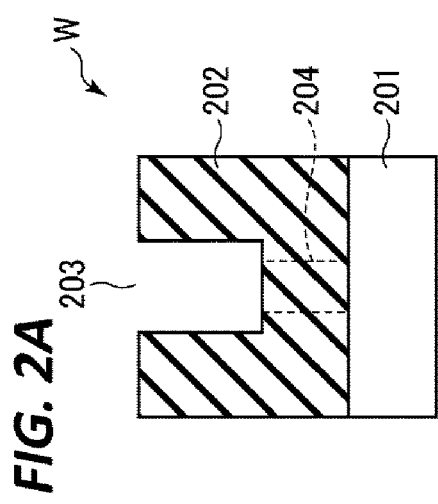

Thereafter, a Ru film 206 is embedded in the trench 203 and the via hole 204 by forming the Ru film 206 by, for example, CVD (step 3, FIG. 2C).

Figure 2D:
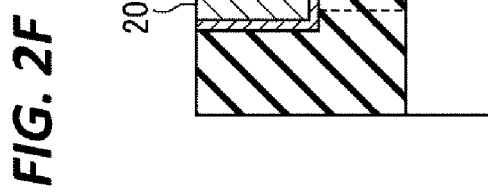

Thereafter, in preparation for a flattening treatment by CMP to be performed later, for example, an additional layer 207 is formed by forming a Ru film by CVD at a film forming rate higher than that at the time of embedding the Ru film (step 4, FIG. 2D).

Figure 2E:
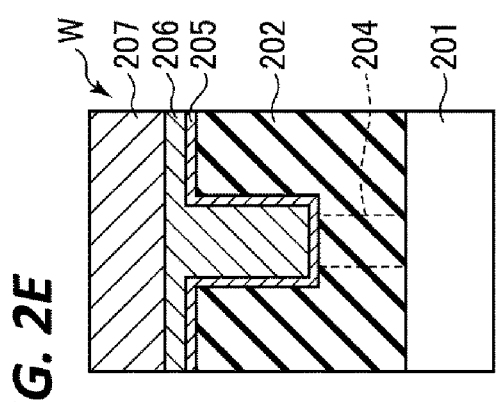

After forming the additional layer 207, an annealing treatment is performed (step 5, FIG. 2E). The annealing treatment is performed in order to reduce resistance by increasing the grain diameter of Ru crystals in the Ru film 206 and to remove impurities such as, for example, carbon (C) or oxygen (O) in the Ru film 206 and the additional layer 207. This treatment is performed using a gas containing $H_2$ gas, for example, a forming gas ($H_2$+Ar or $H_2$+$N_2$). This treatment is not essential, but may be preferably performed because it has a grain diameter increasing effect and an impurity removal effect.

Figure 2F:
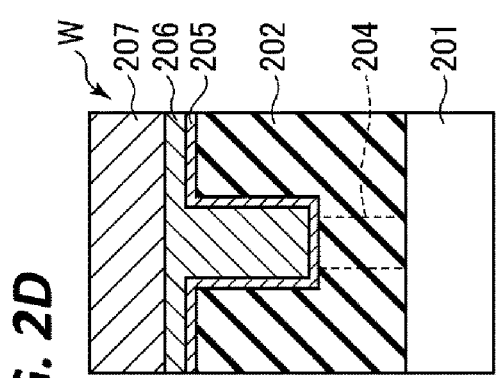

Thereafter, for example, the portions of the additional layer 207, the Ru film 206, and the base film 205 above the surface of the interlayer insulating film 202 are removed for flattening by polishing the entire surface of the wafer W by CMP, which has conventionally been used when manufacturing a Cu wiring (step 6, FIG. 2F). As a result, a Ru wiring 208, which is composed of the base film 205 and the Ru film 206, is formed in the trench 203 and the via hole 204.

<Ru Film Embedding Process and Additional Layer Forming Process>

Next, a process of embedding a Ru film 206 and a process of forming an additional layer 207 will be described in detail.

The embedding Ru film 206 may be formed using ruthenium carbonyl ($Ru_3(CO)_{12}$) as a film forming material by thermal CVD, which thermally decomposes ruthenium carbonyl ($Ru_3(CO)_{12}$) on the wafer W. Thereby, a high-purity thin Ru film may be formed with a high step coverage so as to embed the Ru film in a narrow trench of about 10 nm. A film formation reaction at this time is as represented in the following Equation (1).

$$Ru_3(CO)_{12}(s)+Heat \rightarrow 3Ru(s)+12CO\uparrow \qquad (1)$$

Film formation conditions at this time are, for example, as follows: the pressure within a processing container in a range of 0.013 Pa to 133.3 Pa (0.1 mTorr to 1 Torr), preferably in a range of 1.3 Pa to 66.5 Pa (10 mTorr to 500 mTorr), and a film formation temperature (wafer temperature) in a range of 120° C. to 300° C., preferably in a range of 130° C. to 250° C.

The Ru film 206 may be formed using a film forming material other than ruthenium carbonyl, for example, a Ruthenium pentadienyl compound such as (cyclopentadienyl) (2,4-dimethylpentadienyl) ruthenium, bis(cyclopentadienyl) (2,4-methylpentadienyl) ruthenium, (2,4-dimethylpentadienyl) (ethylcyclopentadienyl) ruthenium, or bis (2,4-methylpentadienyl) (ethylcyclopentadienyl) ruthenium. When using these, the film may be formed by CVD using a reducing gas as necessary, in addition to a film forming raw material gas. Meanwhile, in the present exemplary embodiment, ALD is also included in CVD for formation of the Ru film.

At the time of embedding the Ru film 206, the Ru film 206 may have a thickness that is enough to substantially completely fill the trench 203, and may be thicker than the thickness. For example, when the trench width is 10 nm, the thickness of the Ru film 206 may be about 5 nm or slightly larger than 5 nm.

As in the case of embedding the Ru film 206, an additional layer 207 may be formed by forming a Ru film using ruthenium carbonyl ($Ru_3(CO)_{12}$) as a film forming material by thermal CVD, which thermally decomposes ruthenium carbonyl ($Ru_3(CO)_{12}$) on the wafer W. In addition, the film may be formed by CVD using another film forming material such as, for example, the aforementioned ruthenium pentadienyl compound.

The additional layer 207 serves to allow the Ru film to be formed to a certain thickness on the entire surface of the wafer at the time of a flattening treatment by CMP. For example, when the trench width is 10 nm, the thickness of the Ru film required for filling the trench may be 5 nm or slightly larger than this, whereas the additional layer may need to have a thickness larger than 15 nm.

In the case of embedding the Ru film 206 in the fine trench 203 and the via hole 204, it is important to control a film forming rate because nucleation in the trench 203 or the via hole 204 needs to be controlled and conformal film formation is required. As a result, a film forming rate at the time of the embedding process of the Ru film 206 is slow (e.g., the film forming rate<2 nm/min). Therefore, when the Ru film is formed to a height required for flattening by CMP under the condition at the time of embedding the Ru film, the total process time for manufacturing the Ru wiring is increased.

However, after the fine trench 203 and the via hole 204 are filled, it is not necessary to lower the film forming rate as in the case of embedding the Ru film since the film is formed on the flattened portion.

Therefore, by separating the embedding of the Ru film in the trench 203 and the via hole 204 and the formation of the film on the flattened portion, a film formation condition is set in such a manner that the film forming rate when the additional layer 207 is formed by forming the Ru film on the flattened portion after forming the embedding Ru film 206 is higher than the film forming rate at the time of embedding the Ru film. Thereby, the total process time may be reduced.

Process parameters, which have an influence on the film forming rate, include a film forming temperature (wafer temperature), the supply amount of a raw material gas, a processing pressure, and a gap between the wafer and the gas discharge surface of a shower head. The higher the film forming temperature, the larger the supply amount of a raw material gas, the lower the processing pressure, and the wider the gap, the film forming rate is increased. Therefore, by adjusting at least one of these parameters when forming the additional layer 207, the film forming rate may be higher than the film forming rate at the time of embedding the Ru film 206. Among these, the film forming temperature has the greatest influence on the film forming rate. For example, when the film forming temperature is 150° C. at the time of embedding the Ru film 206, and then the film forming temperature is 200° C. at the time of forming the additional layer 207, the film forming rate may be increased by about 200%.

In addition, instead of step 4 of forming the additional layer 207 by adjusting the process parameters as described above, step 4' of adding a hydrogen (H)-containing reducing gas at the time of forming the Ru film, which is the additional layer 207, may be performed. As the H-containing reducing gas, $H_2$ gas may be suitably used. In addition, alternatively, $NH_3$ gas or $SiH_4$ gas may be used as the H-containing reducing gas. The flow rate of the H-containing reducing gas may be in a range of 10 sccm to 500 sccm. By adding the H-containing reducing gas such as $H_2$ gas at the time of forming the Ru film, which is the additional layer 207, without adding the H-containing reducing gas when forming the embedding Ru film 206, a film forming reaction on the wafer may be facilitated, thereby increasing the film forming rate, and the total process time may be reduced as in the case of adjusting the process parameters described above.

Figure 4:
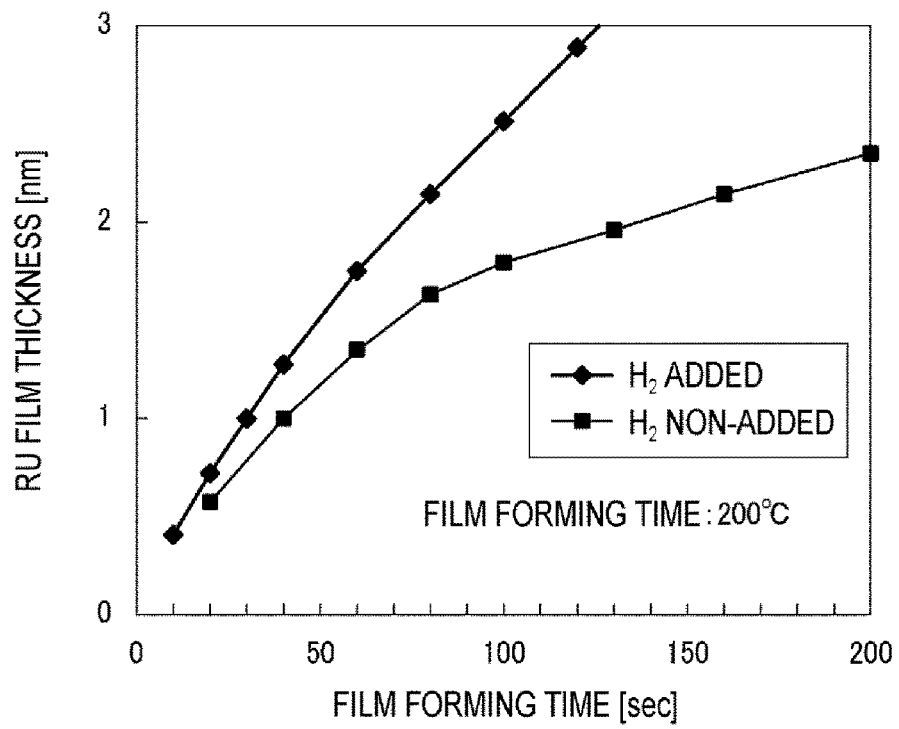
FIG. 4 is a diagram comparing film forming rates between the presence and absence of addition of $H_2$ gas when $Ru_3(CO)_{12}$ is used as a film forming material.

This will be described below with reference to FIG. 4. FIG. 4 is a diagram comparing the film forming rates between the presence and absence of addition of $H_2$ gas when $Ru_3(CO)_{12}$ is used as a film forming raw material. A condition at this time represents a case where the flow rate of $Ru_3(CO)_{12}$ is 0.6 sccm (the flow rate of a carrier gas is 300 sccm), the wafer temperature is 200° C., the pressure is 0.5 Torr, and the flow rate of $H_2$ gas is 100 sccm. As illustrated in FIG. 4, it can be seen that the film forming rate of the Ru film is increased by adding the $H_2$ gas.

In addition, when the H-containing reducing gas such as, for example, $H_2$ gas is added at the time of forming the Ru film, which is the additional layer 207, hydrogen reacts with impurities such as, for example, C or O to exert the action of removing them, thereby being capable of removing impurities in the additional layer 207 and the Ru film 206 embedded in, for example, the trench 203.

Figure 5:
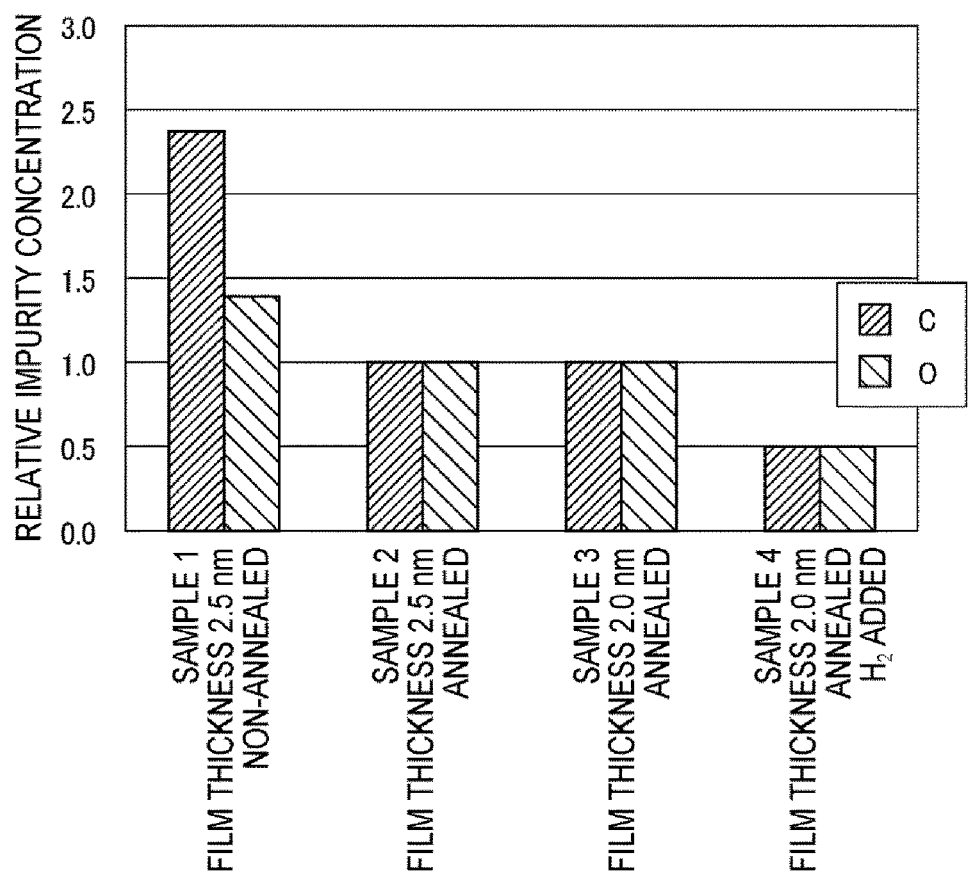
FIG. 5 is a diagram illustrating the difference between impurity removal effects depending on the presence and absence of forming gas annealing and the presence and absence of addition of $H_2$ gas when $Ru_3(CO)_{12}$ is used as a film forming material.

FIG. 5 is a diagram illustrating the relative concentrations of C and O, which are impurities, in the case where a Ru film of 2.5 nm is formed using $Ru_3(CO)_{12}$ without adding $H_2$ gas, and then forming gas annealing is not performed (sample 1), in the case where a Ru film of 2.5 nm is formed using $Ru_3(CO)_{12}$ without adding $H_2$ gas and then forming gas annealing is performed (sample 2), in the case where a Ru film of 2.0 nm is formed using $Ru_3(CO)_{12}$ without adding $H_2$ gas and then forming gas annealing is performed (sample 3), and in the case where a Ru film of 2.0 nm is formed using $Ru_3(CO)_{12}$ by adding $H_2$ gas and then forming gas annealing is performed (sample 4). When comparing sample 1 and sample 2 with each other in FIG. 5, it can be seen that C and O, which are impurities, are reduced in sample 2 on which forming gas annealing is performed. In addition, when comparing sample 2 and sample 3 with each other in which the Ru film thickness is 2.5 nm or 2.0 nm and forming gas annealing is performed, the amount of impurities are about the same. In addition, when comparing sample 3 for which $H_2$ gas is not added at the time of film formation with sample 4 for which $H_2$ gas is added at the time of film formation, it can be seen that C and O, which are impurities, are further reduced by adding $H_2$ gas. From this, it has been found that the impurity removal effect, which is the same as the forming gas annealing may be obtained by adding the H-containing reducing gas such as, for example, $H_2$ gas at the time of forming the Ru film, which is the additional layer 207.

In addition, the crystal growth of the Ru film 206 may also be anticipated by supplying the H-containing reducing gas when forming the additional layer 207.

Figure 3:
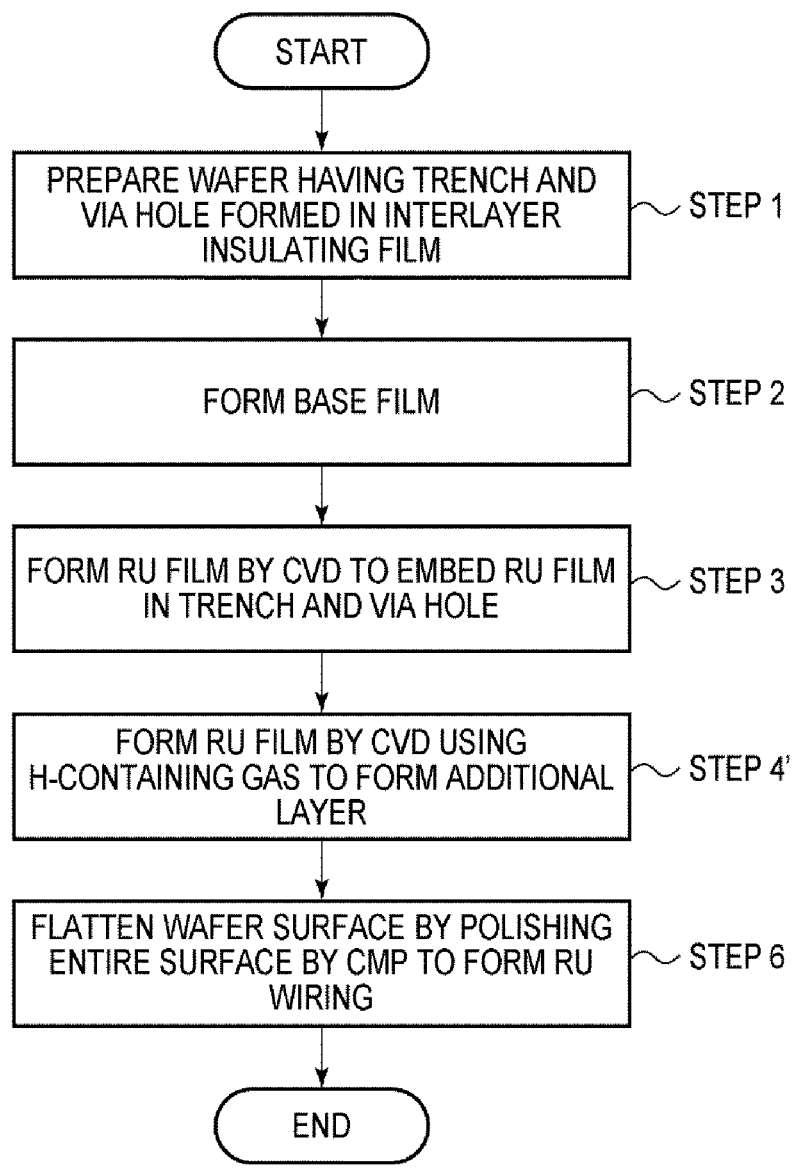
FIG. 3 is a flowchart schematically illustrating a method of manufacturing a Ru wiring according to another exemplary embodiment of the present disclosure.

That is, as illustrated in the flowchart of FIG. 3, instead of step 4, by performing step 4' of adding the H-containing reducing gas such as, for example, $H_2$ gas at the time of forming the Ru film, which is the additional layer 207, the same effect as that obtained in a case of the presence of annealing may be obtained even if annealing of step 5 is omitted.

When performing step 4' of adding the H-containing reducing gas such as, for example, $H_2$ gas at the time of forming the Ru film, which is the additional layer 207, at least one of the above-mentioned process parameters may also be adjusted so as to further increase the film forming rate.

Meanwhile, in step 4 of forming the additional layer 207 by forming the Ru film at a film forming rate higher than that at the time of embedding described above, the H-containing reducing gas may be added in addition to adjusting at least one of the above process parameters, or the film forming rate may be increased only by adding the H-containing reducing gas. As a result, an impurity removal effect and a crystal grain diameter increasing effect may be obtained, and these effects may be further enhanced by a subsequent annealing treatment in step 5.

<Film Forming System>

Next, an example of a film forming system used to carry out the above-described Ru wiring manufacturing method will be described.

Figure 6:
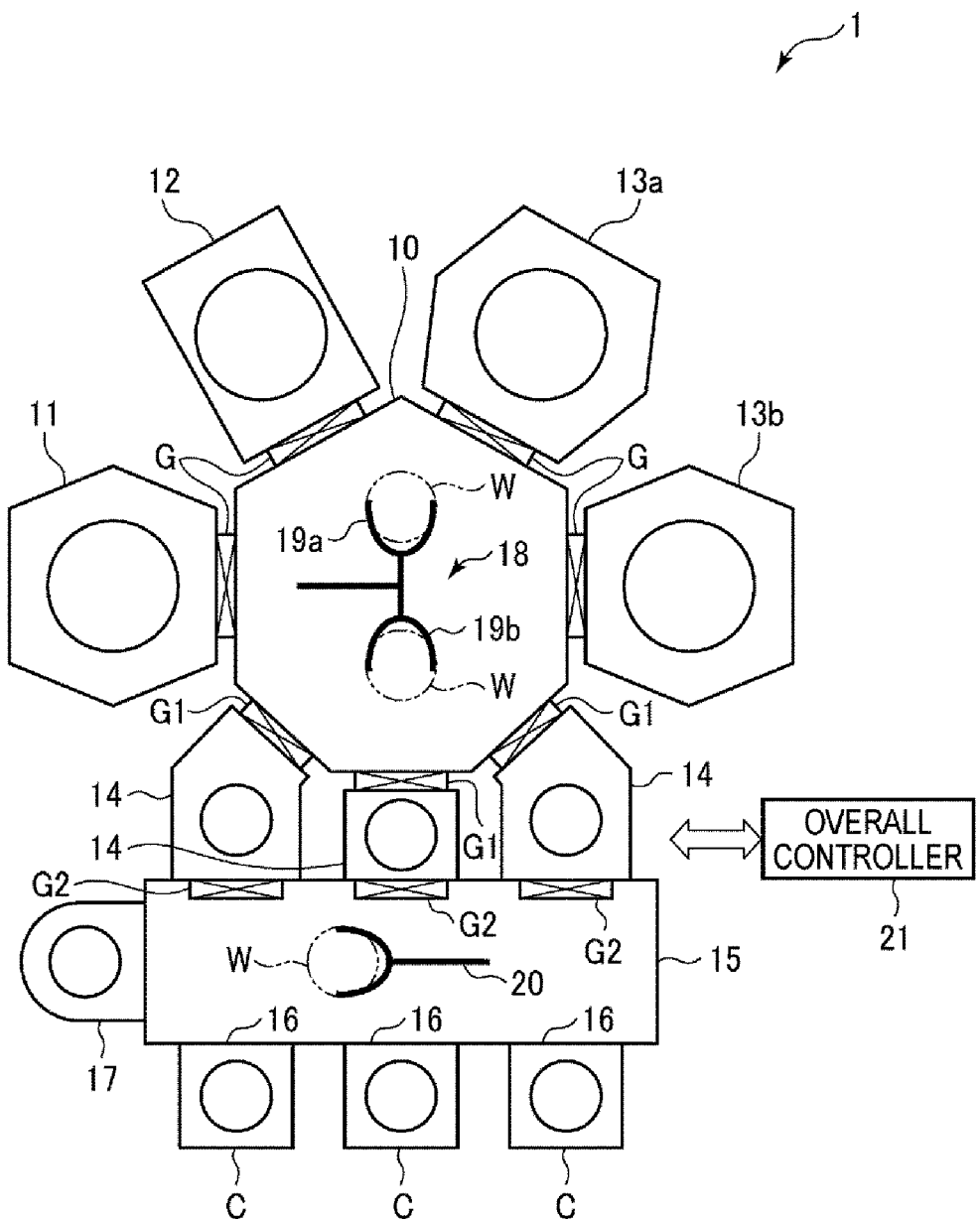
FIG. 6 is a horizontal cross-sectional view schematically illustrating an example of a film forming system used to carry out a method of manufacturing a Ru wiring according to the present disclosure.

FIG. 6 is a horizontal cross-sectional view schematically illustrating an example of such a film forming system.

The film forming system 1 includes a base film forming apparatus 11, a cooling apparatus 12, an embedding Ru film forming apparatus 13a, and an additional Ru film forming apparatus 13b. These are connected respectively to four wall portions of a vacuum transfer chamber 10 having a heptagonal planar shape via gate valves G. The inside of the vacuum transfer chamber 10 is evacuated by a vacuum pump and is kept at a predetermined vacuum degree.

Since there is a difference in the processing temperature between the base film forming apparatus 11 and the embedding Ru film forming apparatus 13a, the cooling apparatus 12 serves to cool down a wafer W processed in the base film forming apparatus 11 to a room temperature before transferring the wafer W to the embedding Ru film forming apparatus 13a, and has a structure in which a cooling plate on which the wafer W is placed is provided in a chamber, which is kept in a vacuum. Meanwhile, the base film forming apparatus 11 forms, as a base film, one of a TiN film, a Ta film, a TaN film, a TaAlN film, and a TiON film by ALD, CVD, or ionized PVD as described above. In addition, the embedding Ru film forming apparatus 13a and the additional Ru film forming apparatus 13b form the film by CVD as will be described below in detail.

Three load lock chambers 14 are connected to the other three wall portions of the vacuum transfer chamber 10 via gate valves G1. An atmospheric transfer chamber 15 is provided at the opposite side of the vacuum transfer chamber 10 with the load lock chambers 14 interposed therebetween. The three load lock chambers 14 are connected to the atmospheric transfer chamber 15 via gate valves G2. The load lock chambers 14 serve to control the pressure between the atmospheric pressure and the vacuum when the wafer W is transferred between the atmospheric transfer chamber 15 and the vacuum transfer chamber 10.

The wall portion, which is opposite to the wall portion of the atmospheric transfer chamber 15 to which the load lock chamber 14 is attached, has three carrier attachment ports 16 to which a carrier (e.g., FOUP) C for accommodating the wafer W. In addition, an alignment chamber 17 is provided on the side wall of the atmospheric transfer chamber 15 to perform alignment of the silicon wafer W. A downflow of clean air is formed in the atmospheric transfer chamber 15.

In the vacuum transfer chamber 10, a transfer mechanism 18 is provided. The transfer mechanism 18 transfers the wafer W to the base film forming apparatus 11, the cooling apparatus 12, the embedding Ru film forming apparatus 13a, the additional Ru film forming apparatus 13b, and the load lock chambers 14. The transfer mechanism 18 includes two transfer arms 19a and 19b, which are movable independently of each other.

A transfer mechanism 20 is provided in the atmospheric transfer chamber 15. The transfer mechanism 20 is configured to transfer the wafer W to carriers C, the load lock chambers 14, and an alignment chamber 17.

The film forming system 1 includes an overall controller 21. The overall controller 21 includes a main controller having a CPU (computer), which controls, for example, respective components of the base film forming apparatus 11, the cooling apparatus 12, the embedding Ru film forming apparatus 13a, and the additional Ru film forming apparatus 13b, an exhaust mechanism or the transfer mechanism 18 of the vacuum transfer chamber 10, an exhaust mechanism or a gas supply mechanism of the load lock chambers 14, the transfer mechanism 20 of the atmospheric transfer chamber 15, a drive system of the gate valves G, G1 and G2, an input device (e.g., a keyboard or a mouse), an output device (e.g., a printer), a display device (e.g., a display), and a storage device (a storage medium). The main controller of the overall controller 21 controls the film forming system 1 to execute a predetermined operation based on, for example, a processing recipe stored in a storage medium set in the storage device or a storage medium set in the storage device.

Next, an operation of the film forming system 1 configured as described above will be described. The following processing operation is executed based on the processing recipe stored in the storage medium in the overall controller 21.

First, the wafer W is taken out from any one carrier C, which is connected to the atmospheric transfer chamber 15, by the transfer mechanism 20, and the gate valve G2 of any one load lock chamber 14 is opened so that the wafer W is carried into the load lock chamber 14. After closing the gate valve G2, the inside of the load lock chamber 14 is evacuated to a vacuum state.

The gate valve G1 is opened at the time when the load lock chamber 14 reaches a predetermined vacuum degree, and the wafer W is taken out from the load lock chamber 14 by any one of the transfer arms 19a and 19b of the transfer mechanism 18 inside the vacuum transfer chamber 10.

Then, the gate valve G of the base film forming apparatus 11 is opened, the wafer W held by any one transfer arm of the transfer mechanism 18 is carried into the base film forming apparatus 11, the gate valve G is closed, and the base film is formed by the base film forming apparatus 11.

After the film formation processing of the base film ends, the gate valve G is opened, the wafer W is carried out by any one transfer arm of the transfer mechanism 18, and the gate valve G of the cooling apparatus 12 is opened so that the wafer W is carried into the cooling apparatus 12. After cooling the wafer W in the cooling apparatus 12, the wafer W is carried out by any one transfer arm of the transfer mechanism 18, and the gate valve G of the embedding Ru film forming apparatus 13a is opened so that the wafer W is carried into the embedding Ru film forming apparatus 13a. Then, an embedding Ru film is formed by the embedding Ru film forming apparatus 13a.

After the film formation of the embedding Ru film, the wafer W is carried out by any one transfer arm of the transfer mechanism 18, and the gate valve G of the additional Ru film forming apparatus 13b is opened so that the wafer W is carried into the additional Ru film forming apparatus 13b. Then, an additional Ru film is formed by the additional Ru film forming apparatus 13b so as to form an additional layer.

After the film formation of the additional layer is performed, the gate valve G of the additional Ru film forming apparatus 13b is opened, and the wafer W therein is carried out by any one of the transfer arms 19a and 19b of the transfer mechanism 18. Subsequently, the gate valve G1 of any one load lock chamber 14 is opened so that the wafer W on the transfer arm is carried into the load lock chamber 14. Then, the inside of the load lock chamber 14 is returned to the atmosphere, and the gate valve G2 is opened so that the wafer W in the load lock chamber 14 is returned to the carrier C by the transfer mechanism 20.

The processing described above is performed concurrently on a plurality of silicon wafers W, whereby the film formation processing of the base film and the film formation processing of the embedding Ru film and the additional Ru film of a predetermined number of wafers W are completed.

After the film formation of the Ru film as the additional layer ends as described above, the carrier C is transferred to an annealing apparatus (not illustrated) so that an annealing treatment is performed on the wafer W. Meanwhile, the annealing treatment may be performed by further providing an annealing apparatus in the film forming system 1, or may be performed by providing an annealing function to any one module such as, for example, the load lock chamber 14 of the film forming system 1. After performing the annealing treatment, the carrier C is transferred to a CMP apparatus (not illustrated) so that a CMP treatment of the wafer W is performed.

<Embedding Ru Film Forming Apparatus>

Figure 7:
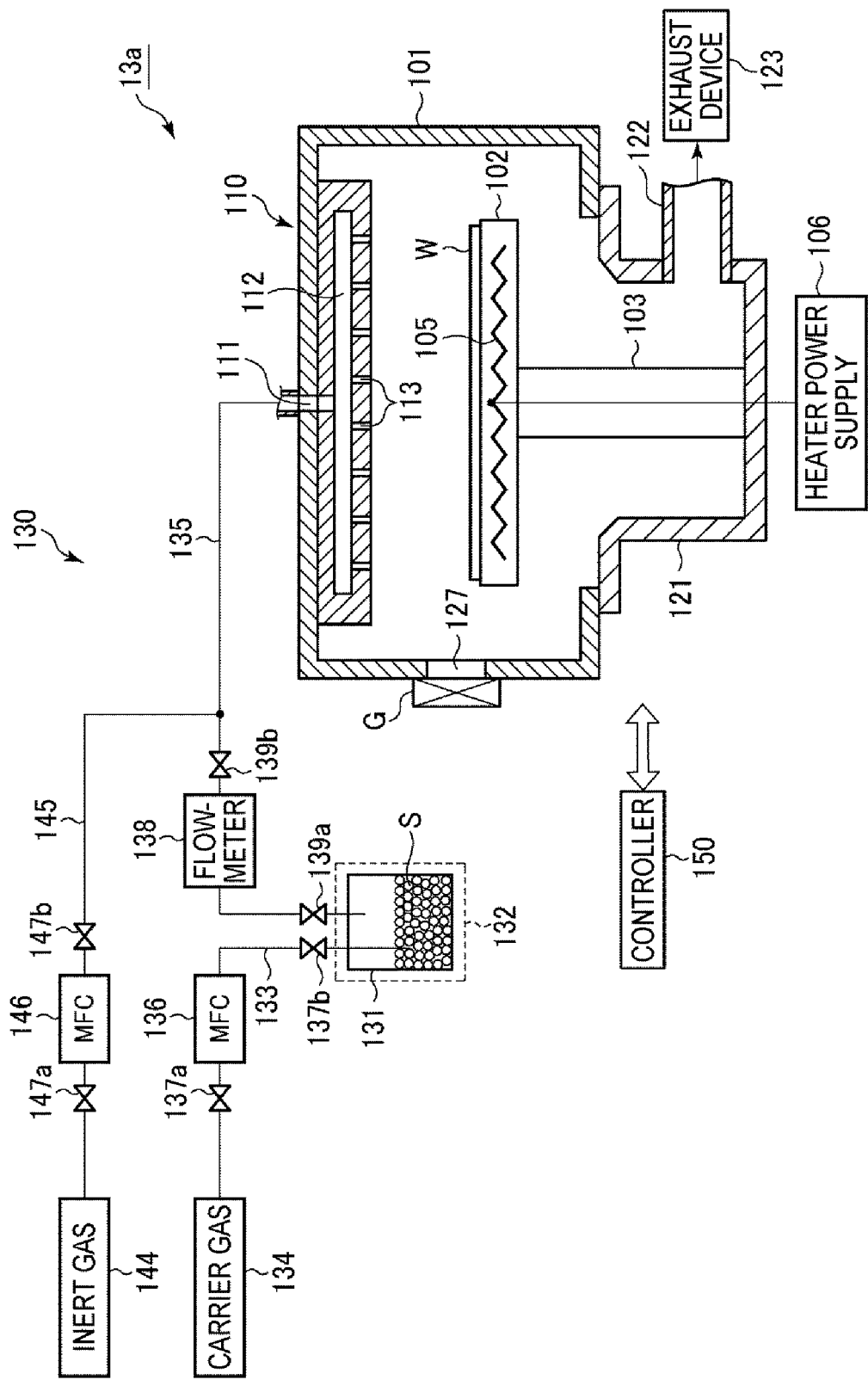
FIG. 7 is a cross-sectional view schematically illustrating an example of an embedding Ru film forming apparatus, which is equipped in the film forming system of FIG. 6.

Next, the embedding Ru film forming apparatus 13a of the film forming system 1 will be described. FIG. 7 is a cross-sectional view schematically illustrating an example of the embedding Ru film forming apparatus 13a.

The Ru film forming apparatus 13a includes a substantially cylindrical chamber 101 configured in an airtight manner, and inside the chamber 101, a susceptor 102 is supported by and placed on a cylindrical support member 103, which is provided at the center of the bottom wall of the chamber 101, in order to horizontally support the wafer W, which is a processing target substrate. A heater 105 is embedded in the susceptor 102. The heater 105 heats the wafer W, which is a processing target substrate, to a predetermined temperature as power is supplied thereto from a heater power supply 106. Meanwhile, the susceptor 102 is provided with a plurality of wafer lifting pins (not illustrated), which may protrude from and retract into the surface of the susceptor 102 in order to support and vertically move the wafer W.

A shower head 110 is provided on the ceiling wall of the chamber 101 so as to face the susceptor 102 in order to introduce a processing gas for the formation of the Ru film by CVD into the chamber 101 in a shower manner The shower head 110 serves to discharge a gas, which is supplied from a gas supply mechanism 130 to be described later, into the chamber 101, and has a gas inlet port 111 formed in the upper portion thereof for the introduction of the gas. In addition, a gas diffusion space 112 is formed inside the shower head 110, and a large number of gas discharge holes 113 are formed in the bottom surface of the shower head 110 so as to communicate with the gas diffusion space 112.

An exhaust chamber 121 is provided in the bottom wall of the chamber 101 so as to protrude downward. An exhaust pipe 122 is connected to the side surface of the exhaust chamber 121, and an exhaust device 123 having, for example, a vacuum pump or a pressure control valve is connected to the exhaust pipe 122. In addition, it is possible to set the inside of the chamber 101 to a predetermined reduced pressure (vacuum) state by operating the exhaust device 123.

A carry-in/out port 127 is provided in the side wall of the chamber 101 for the carry-in and carry-out of the water W between the chamber 101 and the vacuum transfer chamber 10. The carry-in/out port 127 is opened and closed by the gate valve G.

The gas supply mechanism 130 includes a film forming raw material container 131, which accommodates therein ruthenium carbonyl ($Ru_3(CO)_{12}$) as a solid-type film forming raw material S. A heater 132 is provided around the film forming raw material container 131. A carrier gas supply pipe 133 is inserted into the film forming raw material container 131 to supply a carrier gas from above. A carrier gas supply source 134 is connected to the carrier gas supply pipe 133 to supply the carrier gas. As the carrier gas, an inert gas such as, for example, Ar gas or $N_2$ gas, or CO gas may be used. In addition, a film forming raw material gas supply pipe 135 is inserted into the film forming raw material container 131. The film forming raw material gas supply pipe 135 is connected to the gas inlet port 111 of the shower head 110. Thus, the carrier gas is blown into the film forming raw material container 131 from the carrier gas supply source 134 through the carrier gas supply pipe 133, and a ruthenium carbonyl ($Ru_3(CO)_{12}$) gas, sublimated in the film forming raw material container 131, is transferred by the carrier gas to thereby be supplied into the chamber 101 through the film forming raw material gas supply pipe 135 and the shower head 110. The carrier gas supply pipe 133 is provided with a mass flow controller 136 for flow rate control and valves 137a and 137b before and after the mass flow controller 136. In addition, the gas supply pipe 135 is provided with a flow-meter 138 for grasping the amount of ruthenium carbonyl ($Ru_3(CO)_{12}$) gas and valves 139a and 139b before and after the flow-meter 138n.

The gas supply mechanism 130 further includes an inert gas supply source 144 and an inert gas supply pipe 145 connected to the inert gas supply source 144. The other end of the inert gas supply pipe 145 is connected to the film forming raw material gas supply pipe 135. For example, Ar gas or $N_2$ gas is used as the inert gas. The inert gas is used as a purge gas, which purges a gas remaining in the film forming raw material gas supply pipe 135 or the chamber 101. In addition, the inert gas may be used as a dilution gas, which dilutes the film forming raw material gas. The inert gas supply pipe 145 is provided with a mass flow controller 146 for flow rate control and valves 147a and 147b before and after the mass flow controller 146.

The embedding Ru film forming apparatus 13a includes a controller 150 for controlling respective components thereof, for example, the heater power supply 106, the exhaust device 123, and the valves and the mass flow controllers of the gas supply mechanism 130. The controller 150 controls the respective components in response to a command of the overall controller 21.

In the embedding Ru film forming apparatus 13a configured as described above, the wafer W is carried into the chamber 101 from the carry-in/out port 127 by opening the gate valve G, and is then placed on the susceptor 102. The susceptor 102 is heated by the heater 105 to a temperature in a range of 120° C. to 300° C., preferably within a range from 130° C. to 250° C., for example 150° C., and the wafer W is heated as the inert gas is introduced into the chamber 101. The inside of the chamber 101 is evacuated by a vacuum pump of the exhaust device 123 so that the pressure inside the chamber 101 is regulated. At this time, the pressure in the chamber is maintained in the range of 0.013 Pa to 133.3 Pa (0.1 mTorr to 1 Torr), preferably 1.3 Pa to 66.5 Pa (10 mTorr to 500 mTorr), for example, at 1.3 Pa (10 mTorr).

Subsequently, the carrier gas is blown into the film forming raw material container 131 through the carrier gas supply pipe 133 by opening the valves 137a and 137b, and $Ru_3(CO)_{12}$ gas, produced via sublimation by heating of the heater 132 inside the film forming raw material container 131, is transferred by the carrier gas, and is then introduced into the chamber 101 through the film forming raw material gas supply pipe 135 and the shower head 110. The $Ru_3(CO)_{12}$ gas at this time is in the range of 0.1 sccm to 3 sccm, preferably in the range of 0.2 sccm to 1 sccm. At this time, the flow rate of $Ru_3(CO)_{12}$ gas is determined by the flow rate of the carrier gas. For example, when the flow rate of the carrier gas is in a range of 10 sccm to 300 sccm, the $Ru_3(CO)_{12}$ gas may be supplied at a flow rate in a range of 0.1 sccm to 3 sccm. Although, as described above, the inert gas such as, for example, Ar gas or $N_2$ gas, or CO gas may be used as the carrier gas, since, when CO gas is used, it is possible to suppress a decomposition reaction of $Ru_3(CO)_{12}$ gas, represented in the above Equation (1), for example, in the pipe, the film forming gas may be supplied to the wafer W while maintaining the chemical structure of $Ru_3(CO)_{12}$ as much as possible.

After the film formation processing ends, the inside of the chamber 101 is purged, and the gate valve G is opened so that the wafer W is carried out through the carry-in/out port 127 by the transfer mechanism 18.

At the time of forming the embedding Ru film, as described above, since nucleation in the trench or the via hole needs to be controlled and conformal film formation is required, it is important to control a film forming rate, and process parameters such as, for example, a film forming temperature, the flow rate of $Ru_3(CO)_{12}$ gas, a pressure in the chamber, and a gap between the susceptor 102 (wafer W) and the shower head 110 are adjusted so that the film forming rate is set to a low film forming speed below 2 nm/min, for example.

<Additional Ru Film Forming Apparatus>

Next, the additional Ru film forming apparatus 13b of the film forming system 1 will be described.

As described above, the additional Ru film forming apparatus 13b serves to form a Ru film as an additional layer, and a film formation condition is set so that a film forming rate is higher than that at the time of embedding. For example, process parameters such as, for example, a film forming temperature, the flow rate of $Ru_3(CO)_{12}$ gas, a pressure inside the chamber, and a gap between the susceptor 102 (wafer W) and the shower head 110 are adjusted. In a case of adjusting only these process parameters, the additional Ru film forming apparatus 13b may be changed only in the process parameters using the same components as those of the embedding Ru film forming apparatus 13a illustrated in FIG. 7. By adjusting the process parameters so that the film forming rate is higher than the film forming rate at the time of embedding, the total process time may be reduced.

Figure 8:
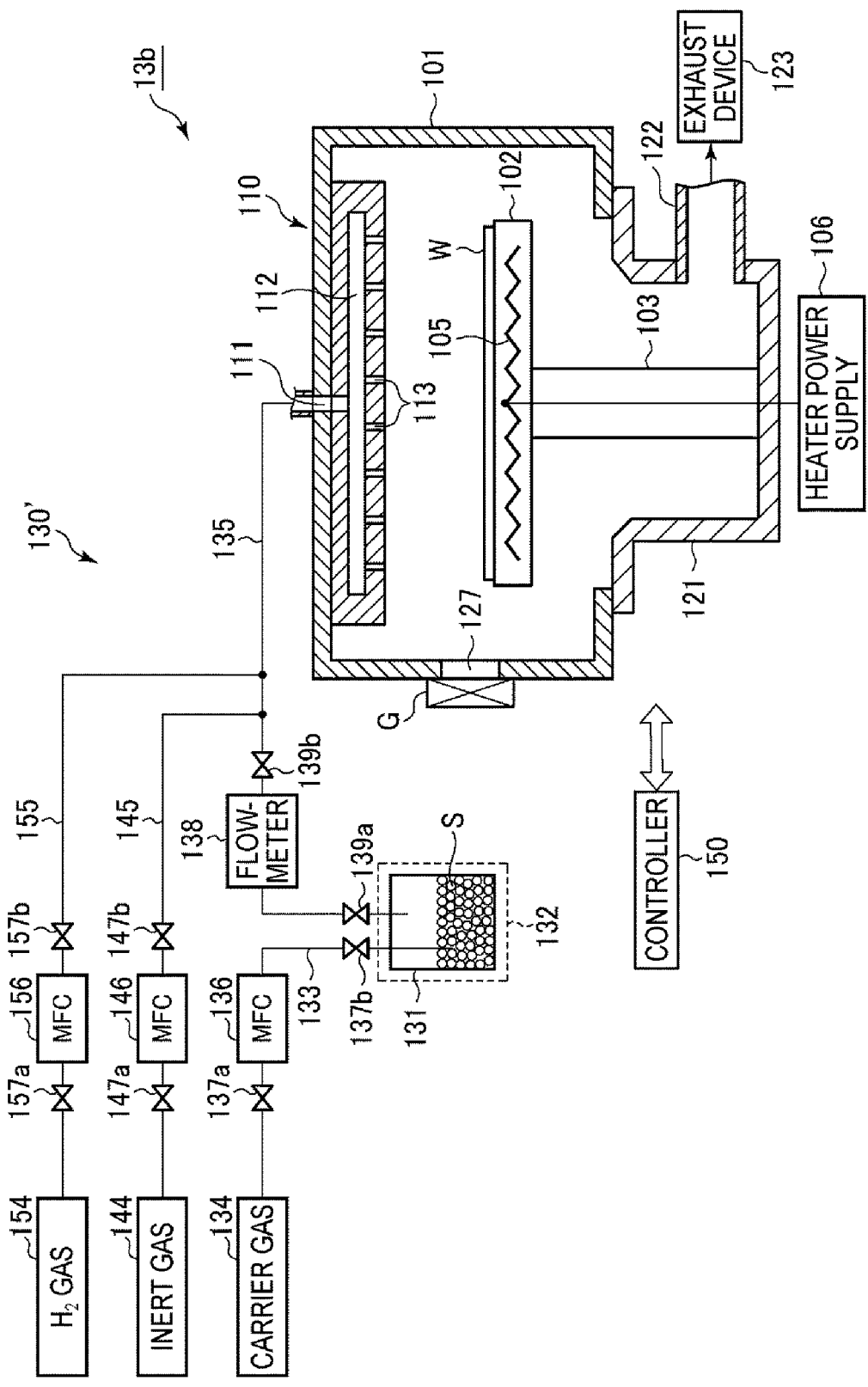
FIG. 8 is a cross-sectional view schematically illustrating an example of an addition Ru film forming apparatus, which is equipped in the film forming system of FIG. 6.

In a case of using, as the additional Ru film forming apparatus 13b, an apparatus, which adds an H-containing reducing gas, for example, $H_2$ gas to obtain an impurity removal effect, in addition to increasing the film forming rate, the additional Ru film forming apparatus 13b is as illustrated in FIG. 8, for example. In FIG. 8, the same reference numerals are given to the same components as those in FIG. 7, and a description thereof will be omitted.

As illustrated in FIG. 8, the additional Ru film forming apparatus 13b in this case includes a gas supply mechanism 130' having a mechanism to supply $H_2$ gas, instead of the gas supply mechanism 130 in FIG. 7. That is, similarly to the gas supply mechanism 130, the gas supply mechanism 130' is configured to supply the film forming raw material S in the film forming raw material container 131 to the chamber 101 by the carrier gas and introduce the inert gas from the inert gas supply source 144 to the chamber 101 through the inert gas supply pipe 145 and the gas supply pipe 135, but further includes a $H_2$ gas supply source 154, which supplies $H_2$ gas as an H-containing reducing gas, and an $H_2$ gas supply pipe 155 connected to the $H_2$ gas supply source 154. The other end of the $H_2$ gas supply pipe 155 is connected to the film forming raw material gas supply pipe 135. The $H_2$ gas supply pipe 155 is provided with a mass flow controller 156 for flow rate control and valves 157a and 157b before and after the mass flow controller 156. As the H-containing reducing gas, $NH_3$ gas or $SiH_4$ gas may be used as described above.

In a case where the additional Ru film forming apparatus 13b has the configuration as illustrated in FIG. 8, at the time of film formation, $Ru_3(CO)_{12}$ gas, which is produced via sublimation by heating of the heater 132 inside the film forming raw material container 131, is transferred by the carrier gas, and is introduced into the chamber 101 through the film forming raw material gas supply pipe 135 and the shower head 110, and $H_2$ gas is supplied from the $H_2$ gas supply source to the chamber 101 through the H2 gas supply pipe 155 and the film forming raw material gas supply pipe 135. Thereby, the film forming rate may be increased by the action of $H_2$ gas, and the total process time may be shortened. In addition, by the action of $H_2$, it is possible to obtain an effect of removing impurities such as C or O, and an effect of promoting crystal growth. Thus, the same effect as the implementation of an annealing treatment may be obtained even without providing an annealing apparatus.

In the apparatus of FIG. 8, in addition to supplying $H_2$ gas, by adjusting at least one of the process parameters, which influence on the above-described film forming rate, the film forming rate may be further increased, and the total process time may be further shortened.

<Experimental Example>

Next, experiment examples will be described.

Here, with respect to a Ru film of 20 nm in total including 5 nm of a portion embedded in a trench and 15 nm of an additional portion, for a case in which the embedded portion and the additional portion were successively embedded under the same condition as the condition at the time of embedding (condition 1) (process A) and a case in which the embedded portion of 5 nm was formed under the embedding condition (condition 1) and then the additional film of 15 nm was formed after changing the film forming condition to an additional condition (condition 2) in which the film forming rate is increased, the process times compared with each other.

At this time, condition 1, which is the embedding condition, and additional condition 2 are as follows.

Condition 1
Film forming temperature (wafer temperature): 150° C.
Pressure in chamber: 10 mTorr
Carrier gas (CO gas) flow rate: 100 sccm (corresponding to $Ru_3(CO)_{12}$ flow rate of 1 sccm)
Condition 2
Film forming temperature (wafer temperature): 195° C.
Pressure in chamber: 100 mTorr
Carrier gas (CO gas) flow rate: 200 sccm (corresponding to $Ru_3(CO)_{12}$ flow rate of 2 sccm)
$H_2$ gas flow rate: 100 sccm.

Figure 9:
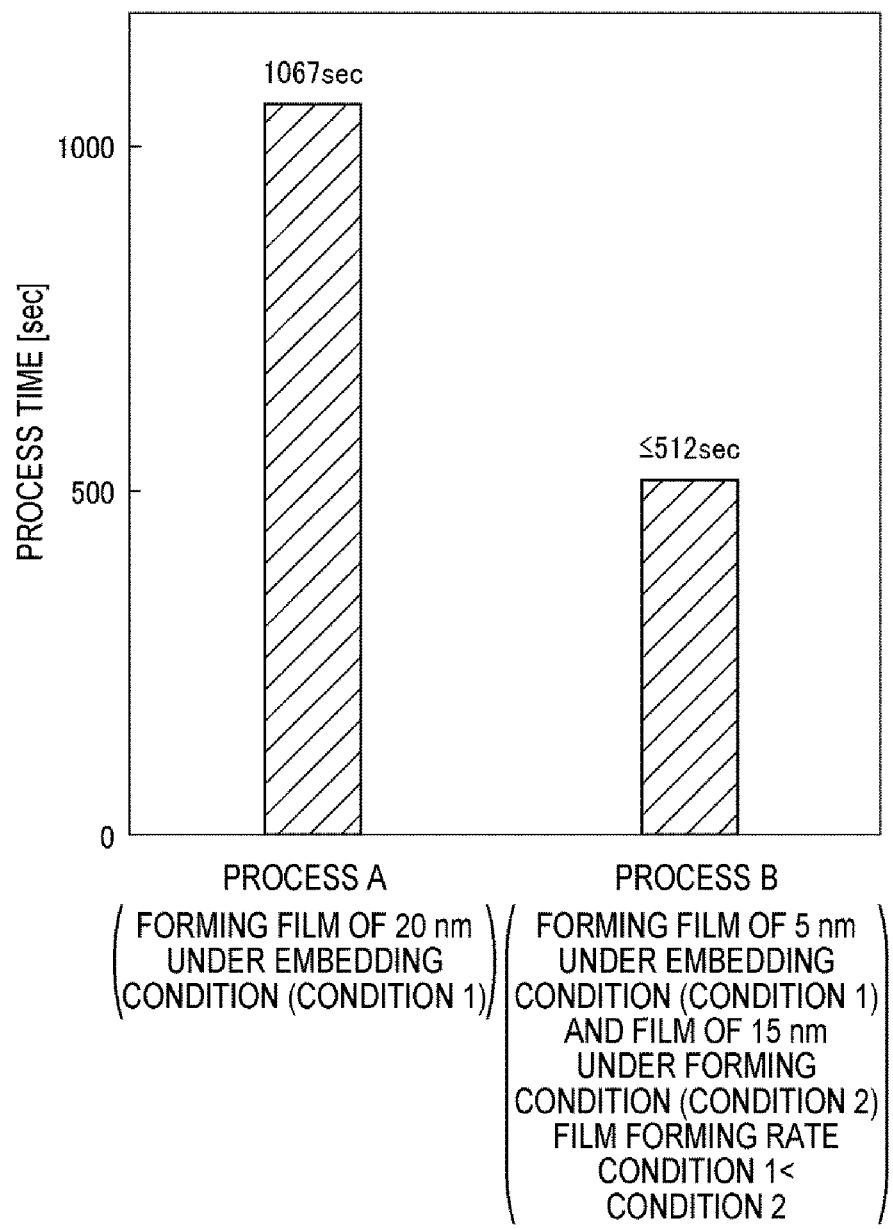
FIG. 9 is a diagram illustrating the effect of the present disclosure.

As a result, as illustrated in FIG. 9, in the case of process A in which the embedded portion and the additional portion (a total of 20 nm) of the Ru film were successively formed under condition 1, which is the embedding, condition the process time was 1067 sec. On the other hand, in the case of process B in which the Ru film was embedded to 5 nm under the condition 1, which is the embedding condition, and then the Ru film as an additional layer was formed to 15 nm under condition 2, which is the additional condition, the process time was 512 sec or less. Thus, it has been found that the process time can be reduced to less than half.

<Other Applications>

Although the exemplary embodiments of the present disclosure have been described above, the present disclosure is not limited to the above-described exemplary embodiments, and various modifications can be made within the scope of the technical idea of the present disclosure. For example, the film forming system, the embedding Ru film forming apparatus, and the additional Ru film forming apparatus described in the above exemplary embodiments are merely given by way of example, and the present disclosure is not limited to these exemplary embodiments. In addition, it is possible to embed the Ru film and form the additional layer by changing the conditions in a single Ru film forming apparatus. However, in the case where it takes time to change condition setting, the embedding Ru film forming apparatus and the additional Ru film forming apparatus may be divided as in the exemplary embodiments.

In addition, in the above-described exemplary embodiment, although a description have been made on the case where the Ru wiring is manufactured by forming a base film on an interlayer insulating film in which a trench and a via hole are formed and then embedding a Ru film, the base film is not essential. In addition, the present disclosure is not limited to the trench or the via hole, but is also applicable to a case where a Ru wiring is manufactured by embedding a Ru film in a substrate having a recess.

In addition, a semiconductor wafer is exemplified as a processing target substrate, but the substrate is not limited thereto in the principle of the present disclosure. Needless to say, other substrates such as, for example, an FPD substrate represented by a substrate for a liquid crystal display device are also applicable.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of manufacturing a ruthenium wiring on a substrate including a predetermined film having a recess formed in a surface thereof by filling the recess, the method comprising:
   depositing a first ruthenium film in the recess and on the surface by forming the first ruthenium film by CVD using a ruthenium raw material gas so that the first ruthenium film fills the recess and cover the surface;
   forming an additional layer by forming a second ruthenium film on the first ruthenium film deposited in the recess and on the surface by CVD using the ruthenium raw material gas at a film forming rate higher than a film forming rate at a time of depositing the first ruthenium film; and
   flattening the second ruthenium film and the first ruthenium film by removing the second ruthenium film and the first ruthenium film on the substrate surface by CMP.

2. The method of claim 1, wherein, when forming the second ruthenium film in the forming the additional layer, the film forming rate is set to be higher than the film forming rate of the first ruthenium film through an adjustment of a process parameter value when forming the first ruthenium film.

3. The method of claim 2, wherein, when forming the second ruthenium film in the forming the additional layer, the film forming rate is increased by at least one of increasing a film forming temperature, increasing an amount of supply of a raw material gas, reducing a processing pressure, and increasing a gap between the substrate and a gas discharge surface as the adjustment of the process parameter value.

4. The method of claim 1, further comprising performing an annealing treatment in a hydrogen-containing atmosphere before the performing the flattening.

5. The method of claim 1, wherein, when forming the formation of the second ruthenium film in the forming the additional layer, the film forming rate is set to be higher than a film forming rate of the first ruthenium film by adding a hydrogen-containing reducing gas.

6. The method of claim 5, wherein the hydrogen-containing reducing gas is at least one of $H_2$ gas, $NH_3$ gas, and $SiH_4$ gas.

7. The method of claim 1, further comprising forming a base film in the recess before forming the first ruthenium film.

8. The method of claim 7, wherein the base film is any one of a TiN film, a Ta film, a TaN film, a TaAlN film, and a TiON film.

9. The method of claim 1, wherein the first ruthenium film and the second ruthenium film are formed using ruthenium carbonyl as the ruthenium raw material gas.

10. The method of claim 9, wherein a processing temperature when forming the first ruthenium film and the second ruthenium film is in a range of 120° C. to 300° C.

11. The method of claim 9, wherein a pressure when forming the first ruthenium film and the second ruthenium film is in a range of 0.013 Pa to 133.33 Pa.

12. A method of manufacturing a ruthenium wiring on a substrate including a predetermined film having a recess formed in a surface thereof by filling the recess, the method comprising:

depositing a first ruthenium film in the recess and on the surface by forming the first ruthenium film by CVD using a ruthenium raw material gas so that the first ruthenium film fills the recess and cover the surface;

forming an additional layer by forming a second ruthenium film on the first ruthenium film deposited in the recess and on the surface by CVD in which a hydrogen-containing reducing gas is added to the ruthenium raw material gas at a film forming rate higher than a film forming rate at a time of depositing the first ruthenium film; and flattening the second ruthenium film and the first ruthenium film by removing the second ruthenium film and the first ruthenium film on the substrate surface by CMP.

13. The method of claim 12, wherein the hydrogen-containing reducing gas is at least one of $H_2$ gas, $NH_3$ gas, and $SiH_4$ gas.

14. The method of claim 12, wherein, when forming the second ruthenium film in the forming the additional layer, the film forming rate is set to be higher than a film forming rate of the first ruthenium film through an adjustment a process parameter value when forming the first ruthenium film.

15. The method of claim 14, wherein, when forming the second ruthenium film in the forming the additional layer, the film forming rate is increased by at least one of increasing a film forming temperature, increasing an amount of supply of a raw material gas, reducing a processing pressure, and increasing a gap between the substrate and a gas discharge surface, as the adjustment of the process parameter value.

* * * * *